United States Patent
Oya et al.

(10) Patent No.: US 11,569,141 B2
(45) Date of Patent: Jan. 31, 2023

(54) SEMICONDUCTOR DEVICE INCLUDING A GROOVE WITHIN A RESIN INSULATING PART POSITIONED BETWEEN AND COVERING PARTS OF A FIRST ELECTRODE AND A SECOND ELECTRODE

(71) Applicant: Mitsubishi Electric Corporation, Tokyo (JP)

(72) Inventors: Daisuke Oya, Tokyo (JP); Yukimasa Hayashida, Fukuoka (JP); Tetsuo Motomiya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/058,283

(22) PCT Filed: Aug. 8, 2018

(86) PCT No.: PCT/JP2018/029708
§ 371 (c)(1),
(2) Date: Nov. 24, 2020

(87) PCT Pub. No.: WO2020/031283
PCT Pub. Date: Feb. 13, 2020

(65) Prior Publication Data
US 2021/0217675 A1    Jul. 15, 2021

(51) Int. Cl.
*H01L 23/08* (2006.01)
*H01L 29/417* (2006.01)
*H01L 23/057* (2006.01)

(52) U.S. Cl.
CPC ............ *H01L 23/057* (2013.01); *H01L 23/08* (2013.01); *H01L 29/41708* (2013.01)

(58) Field of Classification Search
CPC . H01L 23/057; H01L 23/08; H01L 29/41708; H01L 23/13; H01L 23/3735;
(Continued)

(56) References Cited

U.S. PATENT DOCUMENTS

| 6,011,302 A * | 1/2000 | Nakahira | H01L 23/49861 |
| | | | 257/692 |
| 6,060,772 A * | 5/2000 | Sugawara | H01L 24/73 |
| | | | 257/691 |
| 2004/0051172 A1* | 3/2004 | Miyazaki | H01L 23/36 |
| | | | 257/E23.101 |

(Continued)

FOREIGN PATENT DOCUMENTS

| DE | 10 2005 055 713 A1 | 5/2007 |
| EP | 0828341 A2 | 3/1998 |

(Continued)

OTHER PUBLICATIONS

An Office Action; "Notice of Reasons for Refusal", mailed by the Japanese Patent Office dated Mar. 15, 2022, which corresponds to Japanese Patent Application No. 2020-535388 and is related to U.S. Appl. No. 17/058,283; with English language translation.

(Continued)

*Primary Examiner* — Duy T Nguyen
(74) *Attorney, Agent, or Firm* — Studebaker & Brackett PC (57) ABSTRACT

A semiconductor device includes a first electrode; a second electrode; a resin case surrounding the first electrode and the second electrode; and a resin insulating part made of a material the same as a material of the resin case and covering part of the first electrode and part of the second electrode inside the resin case. The resin insulating part contacts an inner wall of the resin case or is separated from the inner wall of the resin case. A move positioned between the first electrode and the second electrode is formed at the resin insulating part, and thus a space in which the resin insulating part does not exist or a material different from the resin insulating part is provided between the first electrode and the second electrode.

22 Claims, 7 Drawing Sheets (58) Field of Classification Search
CPC ... H01L 23/145; H01L 25/072; H01L 23/053;
H01L 25/18
USPC ........................................................ 257/690
See application file for complete search history.

(56) References Cited

U.S. PATENT DOCUMENTS

| | | | | |
|---|---|---|---|---|
| 2010/0283529 | A1* | 11/2010 | Zhang | H01L 29/744 |
| | | | | 257/77 |
| 2014/0003013 | A1* | 1/2014 | Yoo | H01L 25/072 |
| | | | | 361/767 |
| 2018/0247888 | A1* | 8/2018 | Oya | H01L 23/49838 |

FOREIGN PATENT DOCUMENTS

| | | |
|---|---|---|
| JP | H1041460 A | 2/1998 |
| JP | H1084078 A | 3/1998 |
| JP | 2007-150303 A | 6/2007 |

OTHER PUBLICATIONS

Nternational Search Report; Written Opinion; and Notification of Transmittal of the International Search Report and the Written Opinion of the International Searching Authority, or the Declaration issued in PCT/JP2018/029708; dated Oct. 2, 2018.
An Office Action mailed by the German Patent and Trademark Office dated Oct. 25, 2022, which corresponds to German Patent Application No. 112018007892.2 and is related to U.S. Appl. No. 17/058,283; with English language translation.

* cited by examiner

SEMICONDUCTOR DEVICE INCLUDING A GROOVE WITHIN A RESIN INSULATING PART POSITIONED BETWEEN AND COVERING PARTS OF A FIRST ELECTRODE AND A SECOND ELECTRODE

FIELD

The present invention relates to a semiconductor device used for motor control of, for example, an electrical railroad instrument, an electrical power instrument, or an automobile instrument.

BACKGROUND

PTL 1 discloses a semiconductor device that has a reduced amount of sealing resin filling a package and has sufficient dielectric strength between end frames of main terminals. PTL 1 discloses that a recessed groove is formed at the inner wall surface of a resin case to increase the insulation creepage distance between two main terminals.

CITATION LIST

Patent Literature

[PTL 1] JP H10-41460 A

SUMMARY

Technical Problem

To insulate two electrodes from each other while avoiding; increase in the size of a device, a material having an insulation resistance higher than that of air can be provided between the electrodes. For example, when a resin case is provided between the electrodes to achieve insulation between the electrodes, insulating performance potentially degrades due to air bubbles or metallic foreign objects existing in the resin case. The distance between electrodes covered by a resin case has been increased to ensure insulation between the electrodes. In this case, the size of the case inevitably increases, and thus it is difficult to reduce the size of a semiconductor device, in particular, in a high withstand voltage semiconductor module based on assumption of use at high withstand voltage, the distance between electrodes needs to be increased to ensure insulation between the electrodes.

The present invention is intended to solve the above-described problem and provide a semiconductor device that is preferable for downsizing while ensuring insulation between electrodes.

Means for Solving the Problems

According to the present invention, a semiconductor device includes a first electrode, a second electrode, a resin case surrounding the first electrode and the second electrode, and a resin insulating part made of a material same as a material of the resin case and covering part of the first electrode and part of the second electrode inside the resin case, wherein a groove positioned between the first electrode and the second electrode is formed at the resin insulating part.

Other features of this invention will appear more fully from the following description.

Advantageous Effects of Invention

According to the present invention, a groove is provided to a resin insulating part covering electrodes inside a resin case, and thus a semiconductor device preferable for downsizing while ensuring insulation between the electrodes can be provided.

DESCRIPTION OF EMBODIMENTS

Semiconductor devices according to embodiments will be described below with reference to the accompanying drawings. Components identical or corresponding to each other are denoted by an identical reference sign, and duplicate description thereof is omitted in some cases.

Embodiment 1

Figure 1:
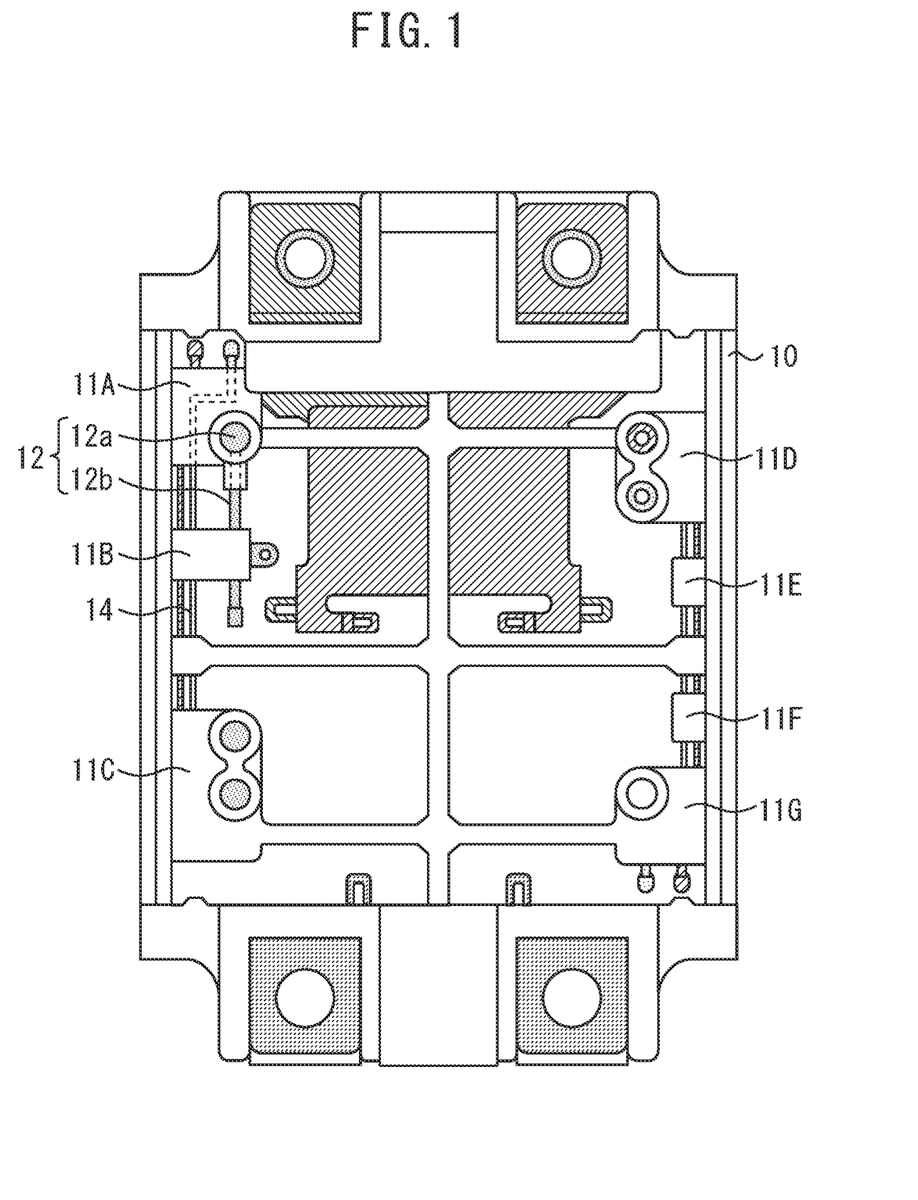
FIG. 1 is a plan view of a semiconductor device according to Embodiment 1.

FIG. 1 is a plan view of a semiconductor device according to Embodiment 1. This semiconductor device includes a resin case 10. The material of the resin case 10 is, for example, engineering plastic such as polyphenylene sulfide resin (PPS), a composite of polyethylene terephthalate (PET) and polybutylene terephthalate (PBT), PBT, or nylon. The material of a cover of the resin case 10 may be the same as that of the resin case 10.

Resin insulating parts 11A, 11B, 11C, 11D, 11E, 11F, and 11G are provided inside the resin case 10. The material of the resin insulating parts 11A, 11B, 11C, 11D, 11E, 11F, and 11G may be the same as that of the resin case 10. The resin insulating parts 11A, 11B, 11C, 11D, 11E, 11F, and 11G contact the inner wall of the resin case 10. At least one of the resin insulating parts 11A, 11B, 11C, 11D, 11E, 11F, and 11G may be separated from the inner wall of the resin case 10. The resin insulating parts 11A, 11B, 11C, 11D, 11E, 11F, and 11G cover at least part of a plurality of different electrodes mainly to ensure insulation between the electrodes.

Figure 2:
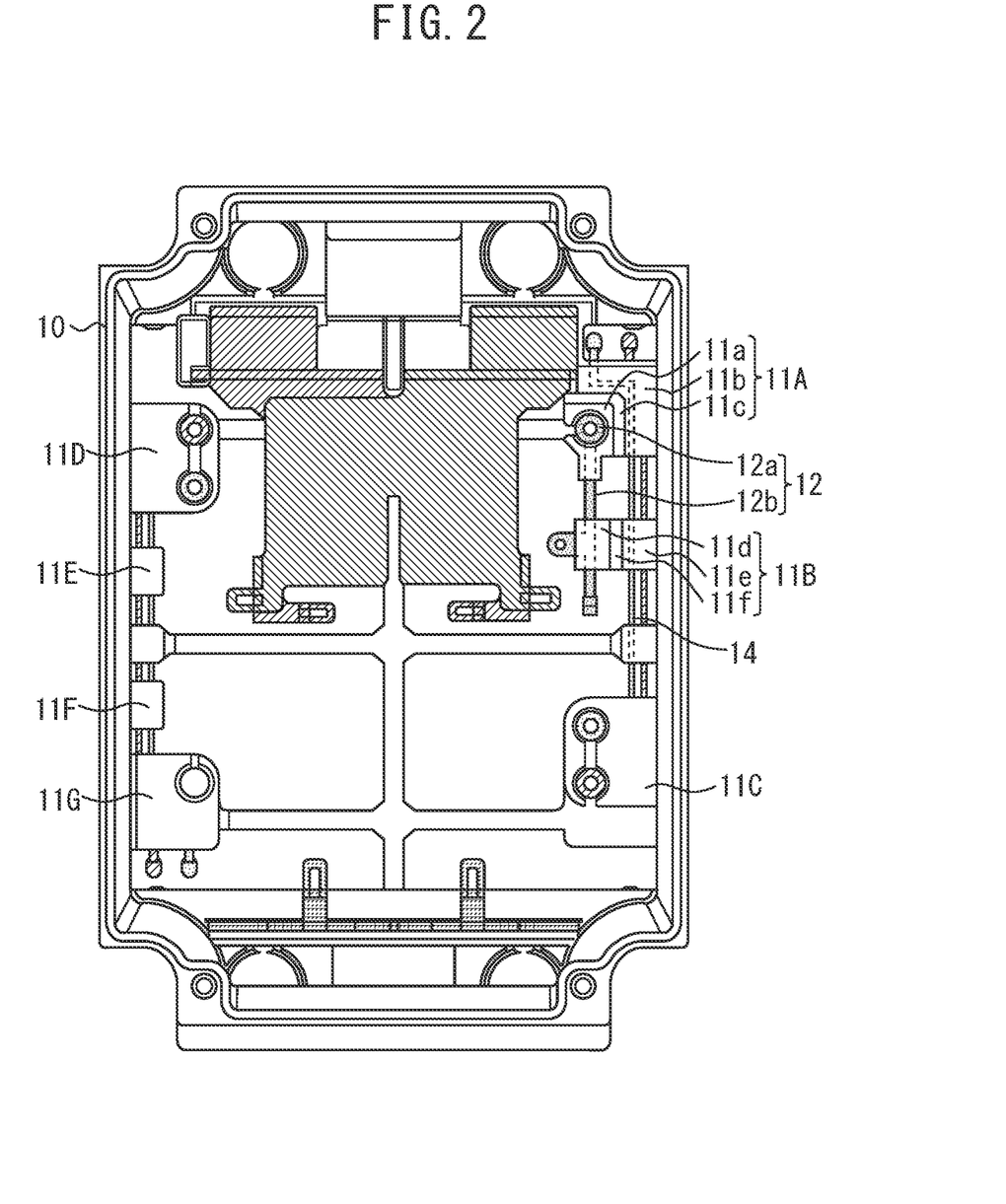
FIG. 2 is a bottom view of the semiconductor device in FIG. 1.
Figure 3:
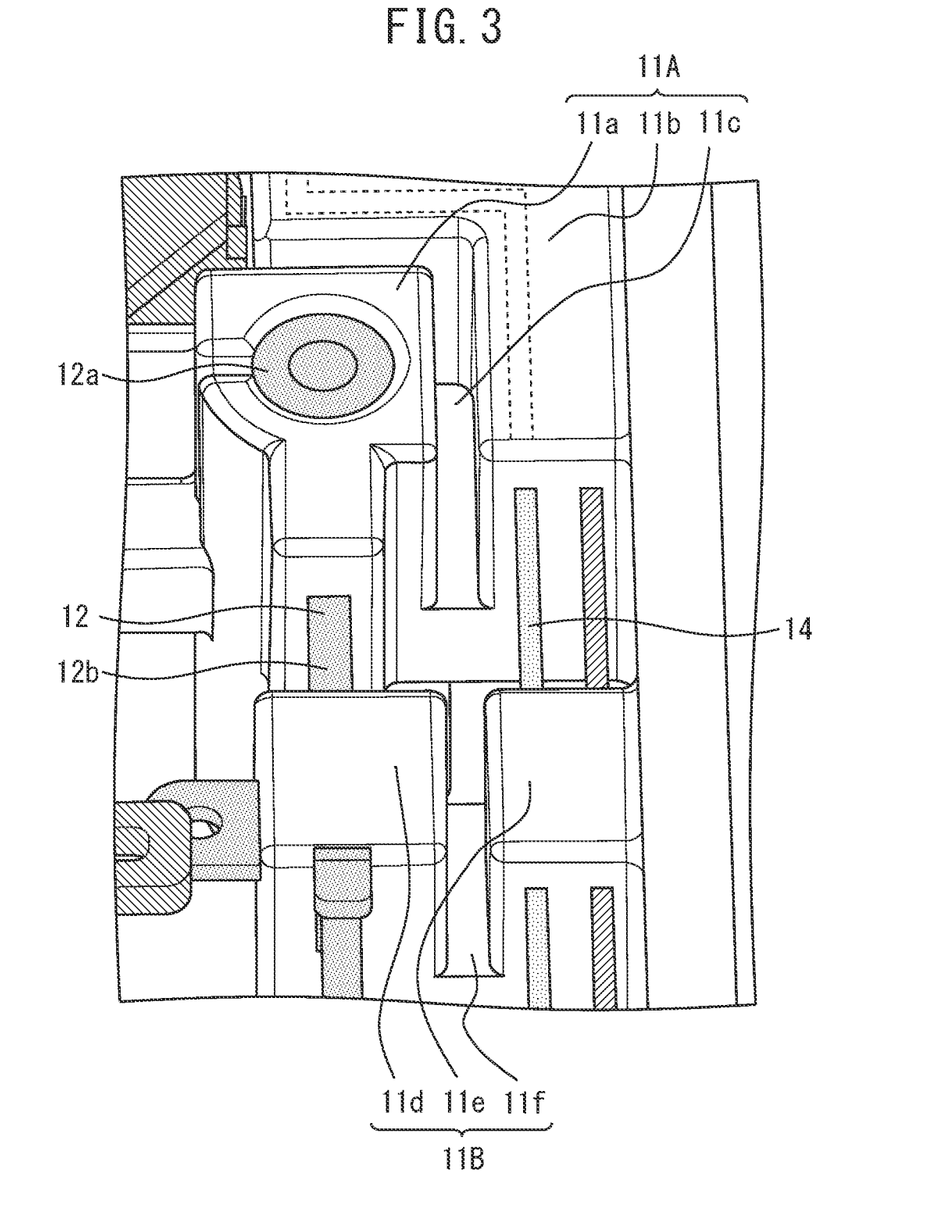
FIG. 3 is an enlarged perspective view of part of FIG. 2.

A first electrode 12 and a second electrode 14 surrounded by the resin case 10 are provided inside the resin case 10. The first electrode 12 and the second electrode 14 may be various electrodes having functions different from each other. For example, the first electrode 12 is a collector electrode, and the second electrode 14 is an emitter electrode. The first electrode 12 includes a wide part 12a, and a narrow part 12b having a width smaller than that of the wide part 12a. In FIGS. 1, 2, and 3, dashed lines illustrate the electrodes covered by the resin insulating parts. FIG. 1 indicates that the resin insulating part 11A covers part of the first electrode 12 and part of the second electrode 14. More specifically, part of the first electrode 12 is entirely covered by the resin insulating part 11A, and part of the second electrode 14 is entirely covered by the resin insulating part 11A. For example, electrodes different from the first electrode 12 and the second electrode 14, such as a control electrode that applies gate voltage of a switching element and a ground electrode may be provided in the resin case 10. The materials of these various electrodes are metals such as SUS, Cu, and Al.

The above-described various electrodes can be incorporated in the resin insulating parts by, for example, insert molding or outsert molding. In a case of the insert molding or the outsert molding, the resin case 10 and the resin insulating parts 11A, 11B, 11C, 11D, 11E, 11F, and 11G can be simultaneously formed.

FIG. 2 is a bottom view of the semiconductor device in FIG. 1. The resin insulating part 11A includes a first part 11a covering part of the first electrode 12, a second part 11b covering part of the second electrode 14, and a groove 11c provided between the first part 11a and the second part 11b. The groove 11c provides a space between the first electrode 12 and the second electrode 14. More specifically, not only the resin insulating part 11A but also the first part 11a, the second part 11b, and the space are provided between the first electrode 12 and the second electrode 14.

The resin insulating part 11B includes a first part 11d covering part of the first electrode 12, a second part 11e covering part of the second electrode 14, and a groove 11f provided between the first part 11d and the second part 11e. The groove 11f provides a space between the first electrode 12 and the second electrode 14. More specifically, not only the resin insulating part 11B but also the first part 11d, the second part 11e, and the space are provided between the first electrode 12 and the second electrode 14.

FIG. 3 is an enlarged perspective view of part of FIG. 2. Part of the second electrode 14, which is covered by the second part 11b has an L shape, and the groove 11c is formed along the shape of the second electrode 14. As a result, the groove 11c has an L shape in plan view. The lower-left part of FIG. 3 indicates that the first electrode 12 bifurcates in the up direction, the down direction, and the left direction. Such a bifurcation part is covered by the first part 11d of the resin insulating part 11B.

Figure 4:
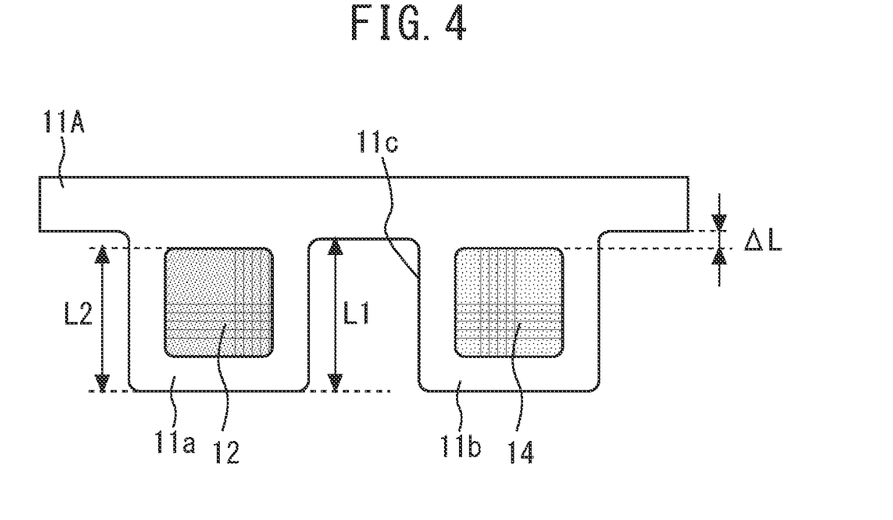
FIG. 4 is a cross-sectional view of the electrodes covered by the resin insulating part.

FIG. 4 is a cross-sectional view of the resin insulating part 11A and the electrodes covered by the resin insulating part 11A, The depth of the groove 11c is denoted by L1. The embedding depth of the first electrode 12 or the second electrode 14 with respect to the position of the opening end of the groove 11c is denoted by L2. The depth L1 is equal to or larger than the depth L2. FIG. 4 illustrates a difference ΔL between the depth L1 and the depth L2. Provision of such a sufficiently deep groove 11c contributes to insulation between the first electrode 12 and the second electrode 14 covered by the resin insulating part 11A.

Figure 11:
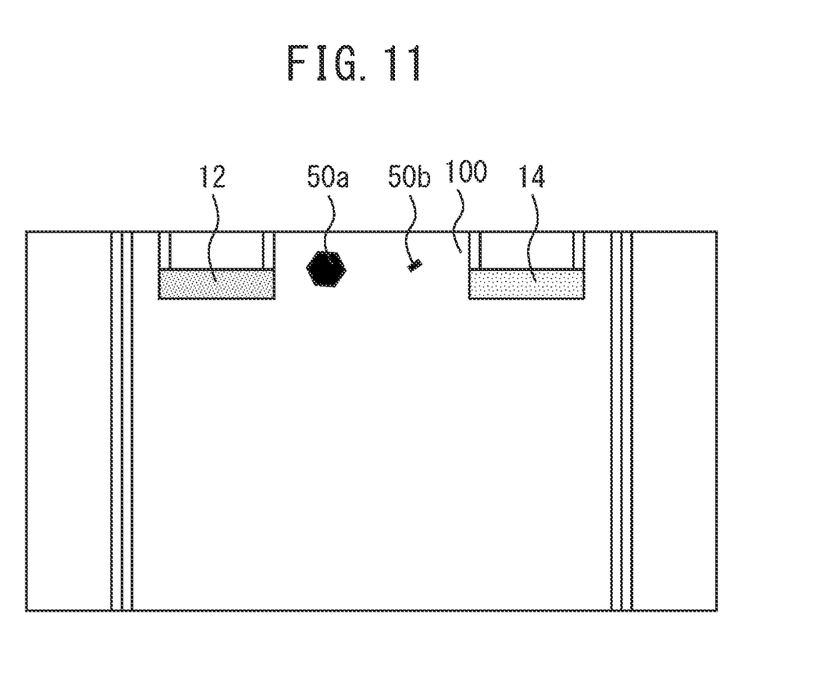
FIG. 11 is a cross-sectional view of a semiconductor device according to a comparative example.

FIG. 11 is a cross-sectional view of a semiconductor device according to a comparative example. FIG. 11 indicates that only a resin 100 is provided between the first electrode 12 and the second electrode 14. In this case, when an air bubble 50a or a metallic foreign object 50b exists in the resin 100, the insulation resistance between the electrodes decreases, and insulation between the electrodes cannot be ensured.

However, according to the semiconductor device according to Embodiment 1, since the groove 11c positioned between the first electrode 12 and the second electrode 14 is formed at the resin insulating part 11A, the first part 11a covering part of the first electrode 12 and the second part 11b covering part of the second electrode 14 are separated from each other through a space. Thus, insulation between the first electrode 12 and the second electrode can be maintained even when an air bubble or a metallic foreign object exists in the first part 11a or the second part 11b. When the groove 11c is provided, the distance between the first electrode 12 and the second electrode does not need to be increased to increase the insulation resistance. Thus, the distance between the electrodes can be shortened while ensuring insulation between the electrodes. Such a characteristic contributes to, for example, reduction of the size of a high withstand voltage semiconductor module product.

The resin insulating part 11B including the groove 11f provides the same effect. It is optional at which resin insulating part a groove is to be formed. Grooves may be formed at all resin insulating parts, or a groove may be formed only at a particular resin insulating part. For example, the necessity of grooves may be determined in accordance with the degree of proximity between the electrodes. Specifically, a groove may be provided to a resin insulating part at a part where the electrodes are close to each other, and a groove may be omitted from a resin insulating part at a part where the electrodes are not close to each other. In the example illustrated in FIG. 2, the groove 11c is provided at the resin insulating part 11A that provides insulation of a part where the first electrode 12 and the second electrode 14 are closest to each other. The groove 11f may be omitted at a part where the resin insulating part 11B is provided when it is determined that the first electrode 12 and the second electrode 14 are not close to each other. The illustrated arrangement of the electrodes and the resin insulating parts are exemplary, and grooves may be provided in accordance with various kinds of electrode arrangement.

The modifications described in Embodiment 1 are also applicable to semiconductor devices according to embodiments below. The semiconductor devices according to the embodiments below have a large number of similarities to the semiconductor device of Embodiment 1, and thus the following description is mainly made on differences from Embodiment 1.

Embodiment 2

Figure 5:
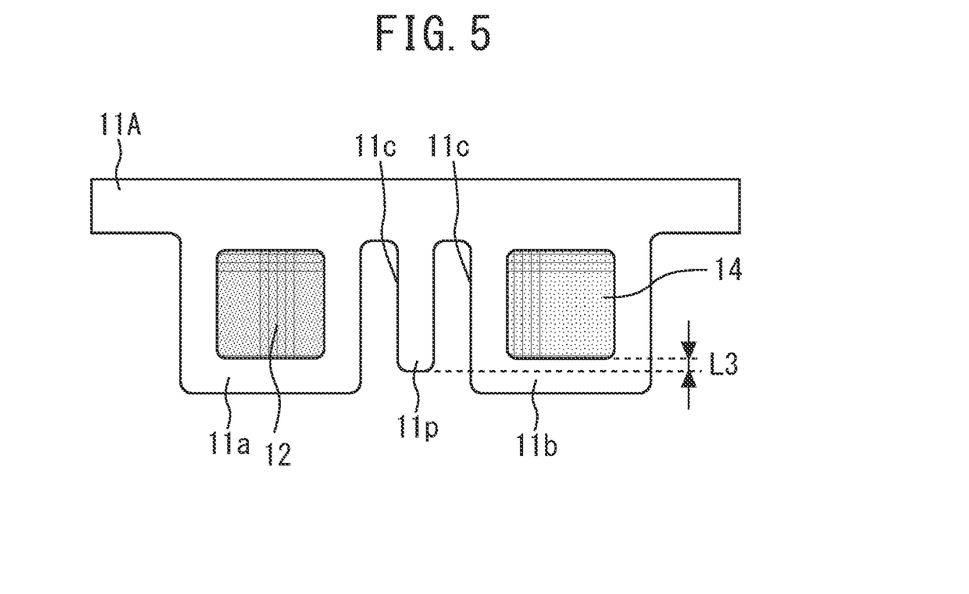
FIG. 5 is a partially cross-sectional view of a semiconductor device according to Embodiment 2.

FIG. 5 is a partially cross-sectional view of a semiconductor device according to Embodiment 2. Two grooves 11c are formed between the first electrode 12 and the second electrode 14 of the resin insulating part 11A. Three grooves 11c or more may be formed. A protrusion part 11p is provided between the first part 11a and the second part 11b to form the two grooves 11c. The protrusion part 11p may be formed of a material the same as that of the resin case 10. The lower end of the protrusion part 11p is provided lower than the lower ends of the first electrode 12 and the second electrode 14 to enhance the insulating property between the electrodes. FIG. 5 indicates that the lower end of the protrusion part 11p is lower than the lower ends of the first electrode 12 and the second electrode 14 by a distance L3. A protrusion part may be provided to a groove other than the grooves 11c.

Embodiment 3

Figure 6:
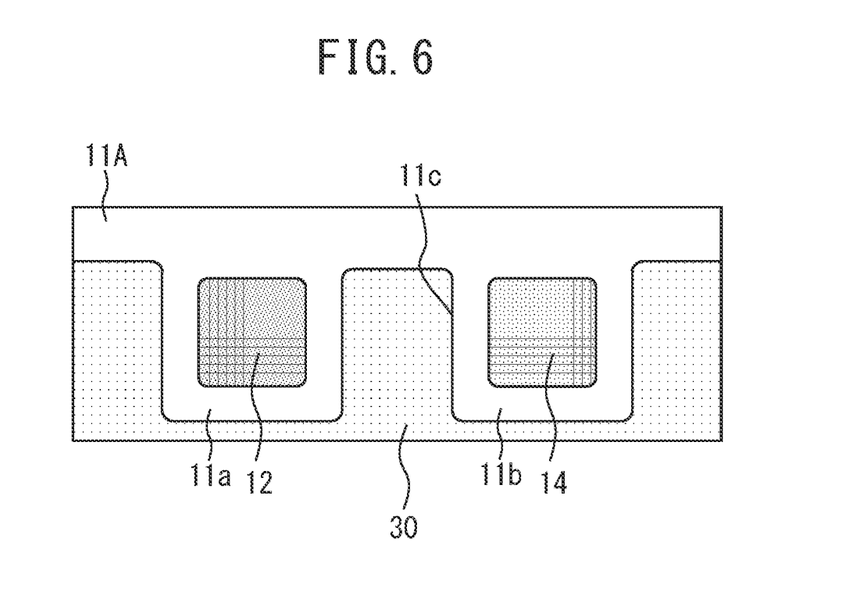
FIG. 6 is a partially cross-sectional view of a semiconductor device according to Embodiment 3.

FIG. 6 is a partially cross-sectional view of a semiconductor device according to Embodiment 3. In this semiconductor device, an insulator 30 having an insulation breakdown voltage higher than that of air is provided to the groove 11c to improve insulating performance between the electrodes. The insulator 30 may be, for example, an organic material or insulation gas. Examples of the organic material include silicone gel, epoxy resin material, polymer resin, gel, and rubber. Examples of the insulation gas include chlorofluorocarbon or SF6 gas. An insulator having an insulating property higher than that of air may be provided to a groove other than the groove 11c.

Figure 7:
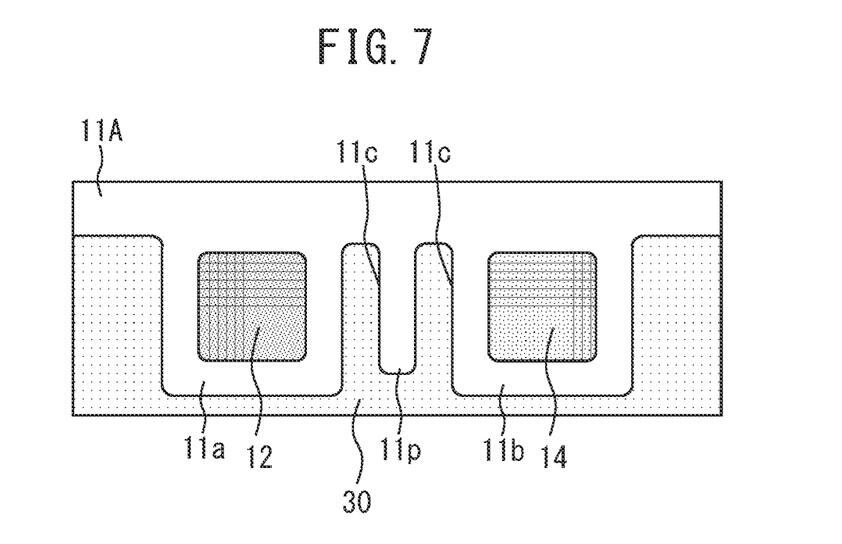
FIG. 7 is a partially cross-sectional view of a semiconductor device according to a modification.

FIG. 7 is a partially cross-sectional view of a semiconductor device according to a modification. As illustrated in FIG. 7, the insulator 30 may be provided to a plurality of grooves 11c provided by the protrusion part 11p.

Embodiment 4

Figure 8:
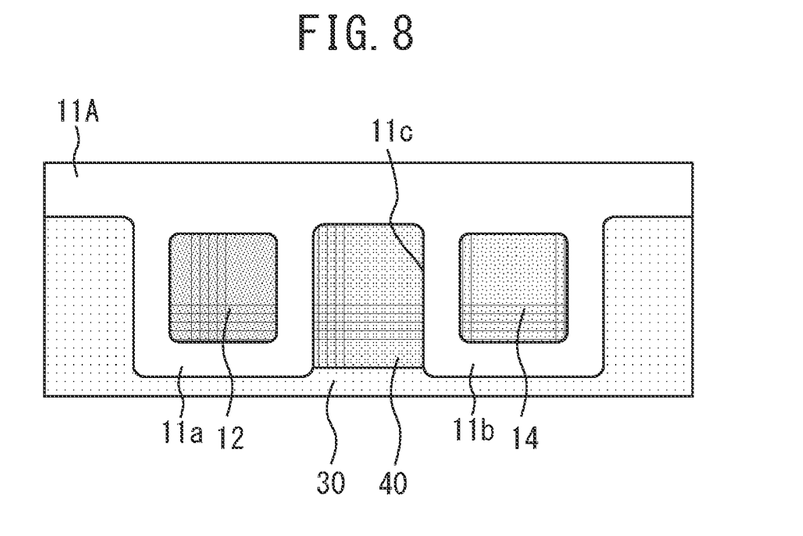
FIG. 8 is a partially cross-sectional view of a semiconductor device according to Embodiment 4.
Figure 9:
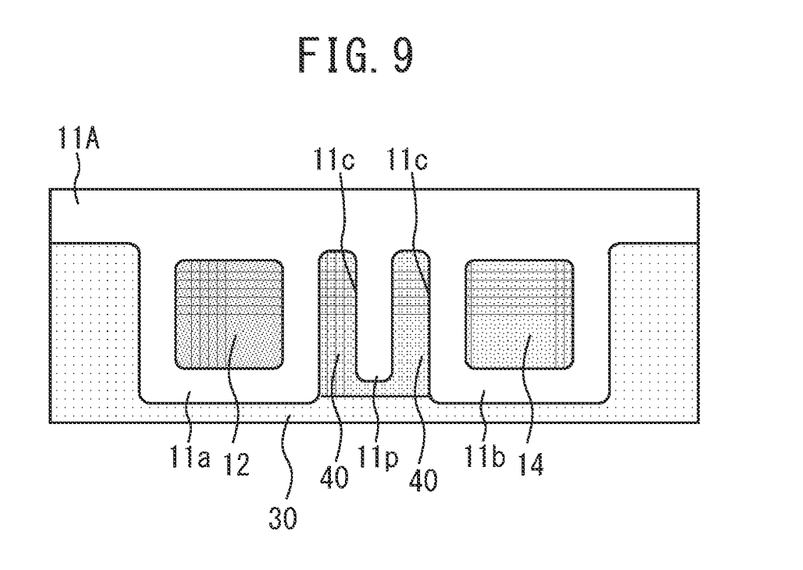
FIG. 9 is a partially cross-sectional view of a semiconductor device according to a modification.

FIG. 8 is a partially cross-sectional view of a semiconductor device according to Embodiment 4. A solid insulator 40 made of an inorganic material is provided to the groove 11c. The insulator 40 is, for example, ceramic. The insulator 40 is provided to enhance the insulating property between the electrodes. FIG. 9 is a partially cross-sectional view of a semiconductor device according to a modification. As illustrated in FIG. 9, the insulator 40 may be provided to a plurality of grooves 11c provided by the protrusion part 11p.

Embodiment 5

Figure 10:
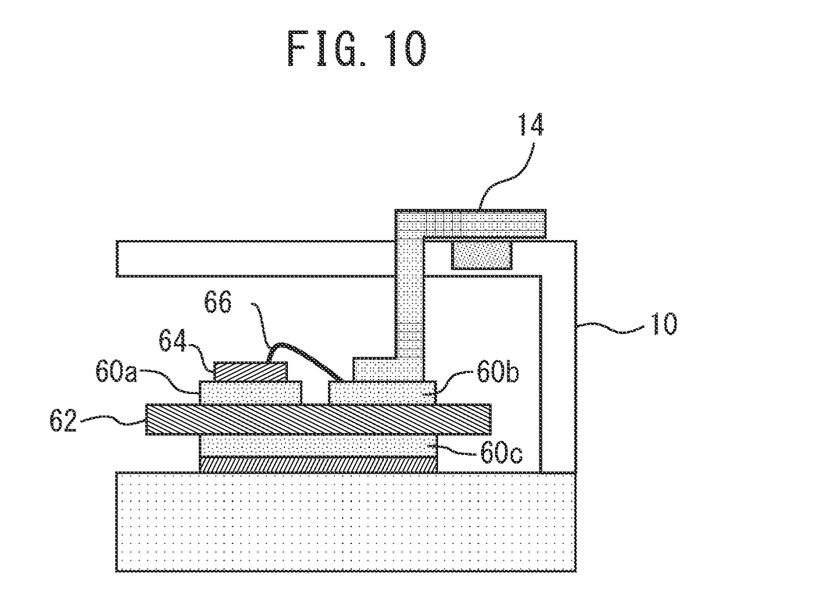
FIG. 10 is a partially cross-sectional view of a semiconductor device according to Embodiment 5.

FIG. 10 is a partially cross-sectional view of a semiconductor device according to Embodiment 5. Embodiment 5 mainly describes the internal structure of the semiconductor device. This internal structure is applicable to all configurations described in Embodiments 1 to 4. Specifically, a semiconductor chip described in Embodiment 5 can be incorporated into a configuration including electrodes, a resin case, and resin insulating parts described in Embodiments 1 to 4.

FIG. 10 illustrates the second electrode 14 inserted into the resin case 10. An insulating material 62 is provided inside the resin case 10. The insulating material 62 is ceramic such as aluminum nitride (AlN), nitridation silicon (SiN), or alumina ($Al_2O_3$), or polymer resin. Metallic patterns 60a and 60b are formed on the upper surface of the insulating material 62, and a metallic pattern 60c is formed on the lower surface of the insulating material 62. The second electrode 14 is fixed to the metallic pattern 60b.

In the resin case 10, a semiconductor chip 64 is fixed to the metallic pattern 60a. The semiconductor chip 64 is, for example, an insulated gate bipolar transistor (RAM or diode made of Si. The material of the semiconductor chip 64 may be a wide handgap semiconductor. The wide bandgap semiconductor is silicon carbide, a gallium nitride material, or diamond. For example, the semiconductor chip 64 may be a SiC-MOSFET or a SiC-Schottky barrier diode (SBD). The metallic pattern 60b is electrically connected with a surface electrode of the semiconductor chip 64 through a bonding wire 66 or the like.

When a semiconductor chip made of a wide handgap semiconductor through which high voltage and large current are applied is employed, the size of a package including the resin case 10 and resin insulating parts tends to be large to ensure the insulation distance between the electrodes inside the resin case 10. Thus, the constraint on the package makes it difficult to achieve downsizing in accordance with the performance of the wide bandgap semiconductor. However, when the configurations described in Embodiments 1 to 4, in which the insulating performance between the electrodes is enhanced, are employed, it is possible to achieve package downsizing while employing a semiconductor chip made of a wide bandgap semiconductor. When the wide bandgap semiconductor is employed, high temperature operation and fast operation can be achieved, and thus the sizes of a cooler and a control circuit around a module can be reduced.

DESCRIPTION OF SYMBOLS 10 resin case, 11A,11B,11C,11D,11E,11F,11G resin insulating parts, 11c, 11f groove, 30,40 insulator

The invention claimed is:
1. A semiconductor device comprising:
a first electrode;
a second electrode;
a resin case surrounding the first electrode and the second electrode; and
a resin insulating part made of a material same as a material of the resin case and covering part of the first electrode and part of the second electrode inside the resin case,
wherein a groove positioned between the first electrode and the second electrode is formed within the resin insulating part, the groove having an opening at each of two opposite ends of the groove.
2. The semiconductor device according to claim 1, wherein the resin insulating part contacts an inner wall of the resin case.
3. The semiconductor device according to claim 2, wherein the groove is provided at a part where the first electrode and the second electrode are closest to each other.
4. The semiconductor device according to claim 2, wherein the first electrode is a collector electrode, and the second electrode is an emitter electrode.
5. The semiconductor device according to claim 2, wherein the groove is one of a plurality of grooves formed within the resin insulating part, each of the plurality of grooves being positioned between the first electrode and the second electrode.
6. The semiconductor device according to claim 1, wherein the groove is provided at a part where the first electrode and the second electrode are closest to each other.
7. The semiconductor device according to claim 6, wherein the first electrode is a collector electrode, and the second electrode is an emitter electrode.
8. The semiconductor device according to claim 6, wherein the groove is one of a plurality of grooves formed within the resin insulating part, each of the plurality of grooves being positioned between the first electrode and the second electrode.
9. The semiconductor device according to claim 1, wherein the first electrode is a collector electrode, and the second electrode is an emitter electrode.
10. The semiconductor device according to claim 1, wherein the groove is one of a plurality of grooves formed within the resin insulating part, each of the plurality of grooves being positioned between the first electrode and the second electrode.

11. The semiconductor device according to claim 1, further comprising an insulator made of an organic material and provided to the groove.

12. The semiconductor device according to claim 1, further comprising a semiconductor chip provided inside the resin case.

13. The semiconductor device according to claim 12, wherein the semiconductor chip is formed of a wide bandgap semiconductor.

14. The semiconductor device according to claim 13, wherein the wide bandgap semiconductor is silicon carbide, a gallium nitride material, or diamond.

15. The semiconductor device according to claim 1, wherein the resin case includes outer walls having a height extending in a direction perpendicular to a plane and the groove extends longitudinally in a direction parallel to the plane.

16. The semiconductor device according to claim 1, the semiconductor device further comprising an insulator made of a different material from the resin case and provided to the groove.

17. A semiconductor device comprising:
a first electrode;
a second electrode;
a resin case surrounding the first electrode and the second electrode; and
a resin insulating part made of a material same as a material of the resin case and covering part of the first electrode and part of the second electrode inside the resin case, wherein
a groove positioned between the first electrode and the second electrode is formed at the resin insulating part, and
a depth of the groove is equal to or larger than an embedding depth of the first electrode or the second electrode with respect to a position of an opening end of the groove.

18. The semiconductor device according to claim 17, wherein the first electrode is a collector electrode, and the second electrode is an emitter electrode.

19. The semiconductor device according to claim 17, wherein the resin insulating part contacts an inner wall of the resin case.

20. The semiconductor device according to claim 17, wherein the groove is provided at a part where the first electrode and the second electrode are closest to each other.

21. A semiconductor device comprising:
a first electrode;
a second electrode;
a resin case surrounding the first electrode and the second electrode; and
a resin insulating part made of a material same as a material of the resin case and covering part of the first electrode and part of the second electrode inside the resin case,
wherein a groove positioned between the first electrode and the second electrode is formed at the resin insulating part, and
the semiconductor device further comprises a solid insulator made of an inorganic material and provided to the groove.

22. A semiconductor device comprising:
a first electrode;
a second electrode;
a resin case surrounding the first electrode and the second electrode; and
a resin insulating part made of a material same as a material of the resin case and covering part of the first electrode and part of the second electrode inside the resin case, wherein
a groove positioned between the first electrode and the second electrode is formed at the resin insulating part, and
the groove is provided with insulation gas having an insulating property higher than an insulating property of air.

* * * * *